US008605481B2

(12) United States Patent
Chen et al.

(10) Patent No.: US 8,605,481 B2
(45) Date of Patent: Dec. 10, 2013

(54) CROSSBAR ARRAY MEMORY ELEMENTS AND RELATED READ METHODS

(75) Inventors: An Chen, Sunnyvale, CA (US); Zoran Krivokapic, Santa Clara, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 365 days.

(21) Appl. No.: 12/895,043

(22) Filed: Sep. 30, 2010

(65) Prior Publication Data

US 2012/0081944 A1 Apr. 5, 2012

(51) Int. Cl.
*G11C 11/00* (2006.01)

(52) U.S. Cl.
USPC ............................ 365/148; 365/163; 365/158

(58) Field of Classification Search
USPC ..................... 365/46, 94, 100, 129, 148, 163; 257/2–5, 9, 288, 310, 506, E21.35; 438/95, 96, 135, 166, 240, 365, 482, 438/486, 597, 785
See application file for complete search history.

(56) References Cited

U.S. PATENT DOCUMENTS 6,627,928 B2 * 9/2003 Peschiaroli et al. .......... 257/288
7,378,870 B2 * 5/2008 Mouttet .......................... 326/38
7,778,061 B2 * 8/2010 Robinett et al. .............. 365/148
2002/0197823 A1 * 12/2002 Yoo et al. ...................... 438/424
2008/0089110 A1 * 4/2008 Robinett et al. .............. 365/148
2008/0099929 A1 * 5/2008 Li et al. ......................... 257/784
2009/0262572 A1 * 10/2009 Krusin-Elbaum et al. .... 365/163

OTHER PUBLICATIONS

Flocke, A., et al. "A Fundamental Analysis of Nano-Crossbars with Non-Linear Switching Materials and its Impact on TiO2 as a Resistive Layer," Nanotechnology 2008; NANO '08 8th IEEE Conference on. Aug. 18-21, 2008. pp. 319-322.

Flocke, A., et al. "Fundamental Analysis of Resistive Nano-Crossbars for the Use in Hybrid Nano/CMOS-Memory," Solid State Circuits Conference, 2007; 33rd European. Sep. 11-13, 2007. pp. 328-331.

Rose, G.S., et al. "Design Approaches for Hybrid CMOS/Molecular Memory based on Experimental Device Data," Great Lakes Symposium on VLSI. 2006. pp. 2-7.

Ziegler, M.M., et al. "Design and Analysis of Crossbar Circuits for Molecular Nanoelectronics," Nanotechnology, 2002. Proceedings of the 2002 2nd IEEE Conference on. 2002. pp. 323-327.

* cited by examiner

*Primary Examiner* — Harry W Byrne
(74) *Attorney, Agent, or Firm* — Ingrassia Fisher & Lorenz, P.C.

(57) ABSTRACT

Apparatus and related fabrication and read methods are provided for crossbar memory elements. An exemplary crossbar memory element includes a crossbar array structure including a set of access lines, unswitched resistance elements coupled electrically in series between the set of access lines and a reference voltage node, and switched resistance elements coupled electrically in series between the first set of access lines and the reference voltage node. To read from a selected access line, the switched resistance element associated with that access line is enabled while the remaining switched resistance elements are disabled.

19 Claims, 6 Drawing Sheets

CROSSBAR ARRAY MEMORY ELEMENTS AND RELATED READ METHODS

TECHNICAL FIELD

Embodiments of the subject matter generally relate to memory elements, and more particularly, relate to peripheral circuitry for reading crossbar array memory elements and related operating methods.

BACKGROUND

Transistors, such as metal oxide semiconductor field-effect transistors (MOSFETs), are the core building block of the vast majority of electronic devices. For example, a memory cell, such as a static random-access memory (SRAM) memory cell, may include a number of transistors. Thus, the size and density of the memory cells are constrained by the transistor size and density. Accordingly, decreasing transistors size, and thus increasing transistor density, has traditionally been a high priority. However, the size and density of the memory cells is fundamentally constrained by the number of transistors used in the memory cell.

In lieu of transistor-based memory cells, a crossbar memory element utilizes two-terminal hysteretic resistive switching elements to provide higher memory density. However, the array of resistive elements produce parasitic conduction paths that impair the ability to accurately read the digital value stored by an individual resistive element, thereby limiting the usefulness of crossbar memory elements.

BRIEF SUMMARY

An apparatus is provided for a memory element. The memory element comprises a crossbar array structure including a set of access lines, a plurality of resistance elements coupled electrically in series between the set of access lines and a reference voltage node, and a plurality of switched resistance elements coupled electrically in series between the first set of access lines and the reference voltage node.

In another embodiment, a method is provided for forming a crossbar memory element. The crossbar memory element includes a crossbar array structure having a first set of access lines and a second set of access lines. The method comprises the steps of forming, for each access line of the first set of access lines, a first resistance element electrically in series between the respective access line and a first node and a second resistance element electrically in series between the respective access line and the first node. The method further comprises the step of forming, for each access line of the first set of access lines, a switching element electrically parallel to the second resistance element of the respective access line.

In yet another embodiment, a method is provided for reading a digital value corresponding to a resistive switching element in a crossbar array structure. The crossbar array structure comprises a first set of access lines, with each access line of the first set of access lines having a first resistance electrically in series between the respective access line and a reference voltage node. The method comprises the steps of enabling a second resistance electrically in series between the reference voltage node and a first access line of the first set of access lines, the first access line being associated with the resistive switching element being read, and identifying the digital value based on a voltage of the first access line after enabling the second resistance electrically in series between the reference voltage node and the first access line.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies described herein may be utilized to read a digital value from a resistive switching element at an addressed location in a crossbar array structure. As described in greater detail below, a first set of conductive access lines of the crossbar array structure are pulled to a first reference voltage, wherein the pulling resistance for a selected access line of the first set of access lines corresponding to the addressed location is greater than the pulling resistance for the unselected access lines. For example, in one embodiment, a selected word line and unselected word lines are concurrently pulled-up to a positive reference voltage, wherein the cumulative pull-up resistance for the selected word line is greater than the pull-up resistance for the unselected word lines. Additionally, a selected access line of a second set of conductive access lines of the crossbar array structure corresponding to the addressed location of the crossbar array structure is pulled to a second reference voltage. For example, in one embodiment, a selected bit line is pulled-down to a ground reference voltage (or negative reference voltage). In this manner, a resistive switching element at the addressed location (e.g., the resistive switching element disposed between the selected word line and the selected bit line) is electrically in series with the pull-up resistance between the positive and ground reference voltages. Depending on the embodiment, the unselected bit lines may be pulled-up to the positive reference voltage or allowed to fluctuate to a floating voltage. As described in greater detail below, pulling up the unselected word lines with a resistance that is less than the pull-up resistance for the selected word line mitigates the impact of parasitic conduction paths in the crossbar array structure, thereby allowing the digital value of an addressed resistive switching element to be reliably read.

Figure 1:
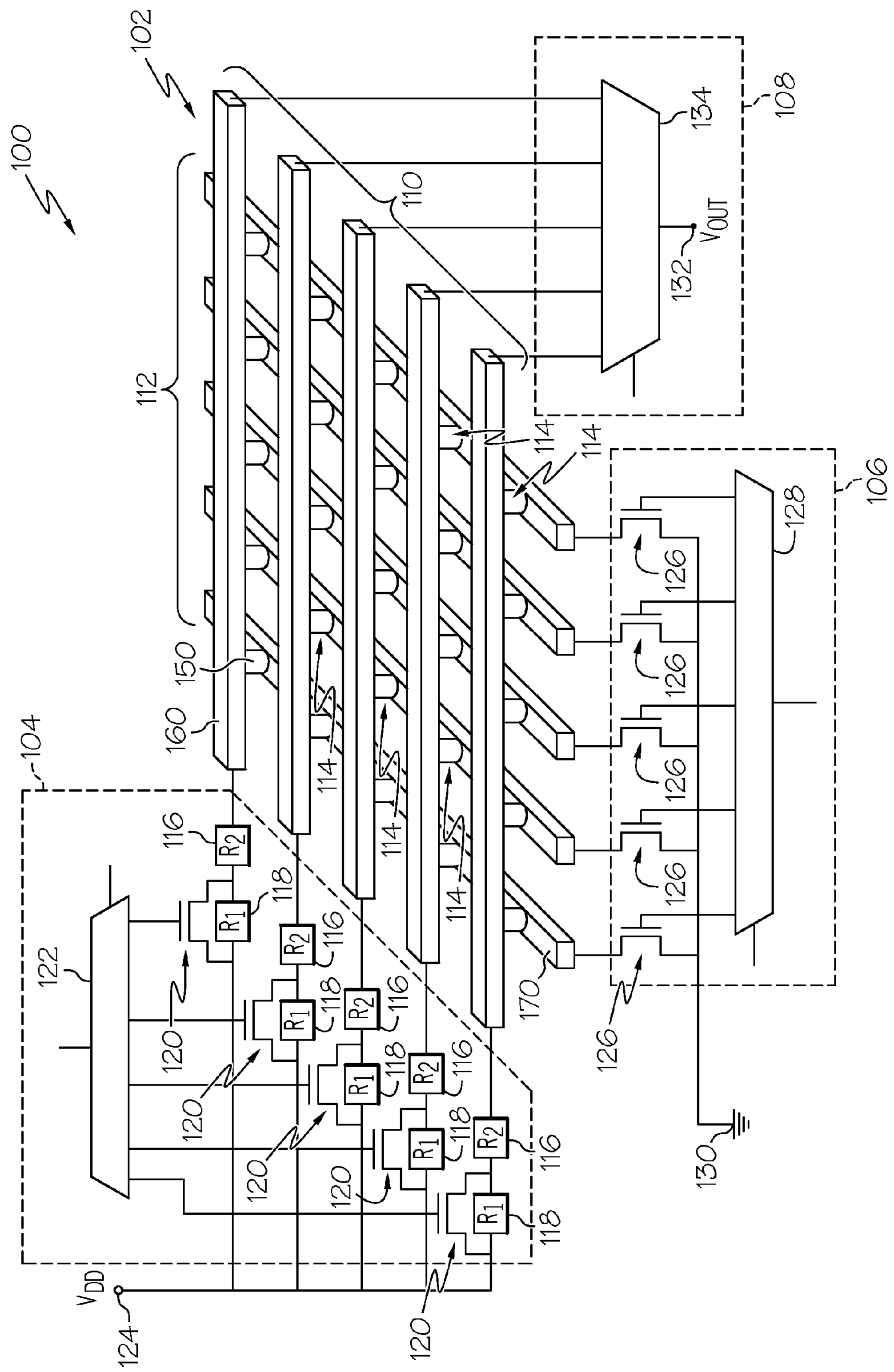
FIG. 1 is a perspective view of an exemplary embodiment of a crossbar memory element.

Referring now to FIG. 1, in an exemplary embodiment, a crossbar memory element 100 includes, without limitation, a crossbar array structure 102, addressing circuitry 104, 106, and output selection circuitry 108. As described in greater detail below, the crossbar array structure 102 includes a first set of conductive access lines 110 overlying and spaced apart from a second set of conductive access lines 112, wherein a plurality of resistive switching elements 114 are disposed between the access lines 110, 112 at each respective location where the access lines 110, 112 overlap to provide a resistive electrical connection between a respective overlapping pair of access lines 110, 112. In this manner, the access lines 110, 112 provide electrodes for accessing (e.g., reading from and/or writing to) the resistive switching elements 114. For convenience, but without limitation, the first set of access lines 110 may alternatively be referred to herein as the word lines of the crossbar array structure 102, and the second set of access lines 112 may alternatively be referred to herein as the bit lines of the crossbar array structure 102.

As illustrated in FIG. 1, in an exemplary embodiment, the first set of access lines 110 are arranged or otherwise aligned in a planar manner. The longitudinal axes of the access lines 110 are oriented in a first direction such that the access lines 110 are parallel to one another. In an exemplary embodiment, the access lines 110 are evenly-spaced by a distance corresponding to the minimum separation distance for the technology. In a similar manner, the second set of access lines 112 are arranged or otherwise aligned in a planar manner, parallel to and evenly-spaced from one another. The longitudinal axes of the access lines 112 are oriented in a second direction that is preferably orthogonal to the direction that the first set of access lines 110 are oriented in. In an exemplary embodiment, the access lines 110, 112 are realized as a conductive metal material, such as copper, however, in some embodiments, other suitable conductive or semiconductive materials, such as polysilicon, may be used.

In an exemplary embodiment, the crossbar array structure 102 includes a first number (m) of word lines, a second number (n) of bit lines 112, and a number of resistive switching elements 114 equal to the product of the number of word lines 110 and the number of bit lines 112 (e.g., m×n resistive switching elements). The resistive switching elements 114 are disposed between the word lines 110 and the bit lines 112 to provide resistive electrical connections between the word lines 110 and the bit lines 112 at locations where the word lines 110 and bit lines 112 overlap. In this regard, the resistive switching elements 114 separate the word lines 110 from the bit lines 112. In some embodiments, the resistive switching elements 114 physically contact the overlying and/or underlying access lines 110, 112 to provide resistive electrical connections between the word lines 110 and the bit lines 112 at overlapping locations. In practice, the crossbar array structure 102 will also include dielectric material that provides electrical isolation between access lines 110, 112 and ensuring the resistive switching elements 114 provide the only electrical connections between access lines 110, 112. The presence of this dielectric material is well known, and accordingly, for ease of illustration and explanation, this dielectric material is not shown in FIG. 1.

Each resistive switching element 114 is realized as a hysteretic resistive switching material capable of having more than one impedance state. In an exemplary embodiment, the resistive switching elements 114 are realized as a bistable resistive switching material capable of exhibiting either a high impedance state ($R_{ON}$) and a low impedance state ($R_{OFF}$). During operation of the crossbar memory element 100, the impedance state of a respective resistive switching element 114 corresponds to a digital value for that particular location in the crossbar array structure 102. For example, the high impedance state may correspond to a logic '1' and the low impedance state may correspond to a logic '0'. The impedance state of a respective resistive switching element 114 may be changed to an impedance state corresponding to a desired digital value by applying a sufficiently high voltage across the respective resistive switching element 114, thereby writing the desired digital value to that location in the crossbar array structure 102. Various methods for writing data and/or digital values to resistive switching elements used in crossbar array structures are known in the art and will not be described herein.

As described in greater detail below, the digital value stored by a resistive switching element 114 at a particular location is identified by operating the addressing circuitry 104, 106 to apply a voltage across the resistive switching element 114, wherein the magnitude of the voltage across the addressed resistive switching element 114 is influenced by its impedance state. Based on the magnitude of the voltage across the addressed resistive switching element 114, the impedance state of the addressed resistive switching element 114 may be identified, and thereby, the digital value corresponding to that impedance state is identified as the digital value stored by the addressed resistive switching element 114. In an exemplary embodiment, the ratio of the high impedance state ($R_{ON}$) to the low impedance state ($R_{OFF}$) is preferably greater than about 10 (e.g., $R_{ON}/R_{OFF}>10$), and is typically on the order of about 1000, to provide a desired voltage difference (or voltage swing) between the voltage across the resistive switching element 114 in the high impedance state (e.g., the high impedance voltage output) and the voltage across the resistive switching element 114 in the low impedance state (e.g., the low impedance voltage output). The resistive electrical connections (e.g., the parasitic conduction paths) provided between the access lines 110, 112 by the non-addressed resistive switching elements 114 influence the voltage across an addressed resistive switching element 114, thereby reducing the difference between the high impedance voltage output and the low impedance voltage output for the addressed resistive switching element 114. As described in greater detail below, the addressing circuitry 104, 106 are operated in a manner that mitigates the reduction in the difference between the high impedance voltage output and the low impedance voltage output for the addressed resistive switching element 114 caused by the parasitic conduction paths, thereby ensuring a voltage differential (or voltage swing) between the high impedance voltage output and the low impedance voltage output that allows the digital value of the addressed resistive switching element 114 to be accurately read.

In an exemplary embodiment, the crossbar memory element 100 includes word line addressing circuitry 104 coupled to the word lines 110 of the crossbar array structure 102. In the illustrated embodiment, the word line addressing circuitry 104 includes, for each word line of the plurality of word lines 110, an unswitched resistance element 116 and a switched resistance element 118 coupled electrically in series between a respective word line 110 and a first reference voltage node 124. In this manner, the resistance elements 116, 118 pull the word lines 110 to the voltage potential at the reference voltage node 124. In an exemplary embodiment, each switched resistance element 118 has a switching element 120 configured electrically parallel to it. For each word line 110, when its respective switching element 120 is opened, turned off, disabled, or otherwise deactivated, its respective switched resistance element 118 is enabled and its respective resistance elements 116, 118 are coupled electrically in series between the respective word line 110 and the reference voltage node 124.

In an exemplary embodiment, resistance elements 116, 118 are realized as resistors, with the unswitched resistance elements 116 each having substantially the same resistance value (e.g., within realistic and/or practical operating tolerances), and the switched resistance elements 118 each having substantially the same resistance value. As described in greater detail below, the resistances of the resistance elements 116, 118 are chosen to provide a desired voltage difference between the high impedance output voltage and the low impedance output voltage for an addressed resistive switching element 114 that allows the digital value stored by the addressed resistive switching element 114 to be accurately read regardless of the parasitic conduction paths caused by the non-addressed resistive switching elements 114. In this regard, the ratio between the resistance of the switched resistance elements 118 ($R_1$) and the resistance of the unswitched resistance elements 116 ($R_2$) will vary depending upon the characteristics of the resistive switching elements 114 (e.g., the high impedance state resistance ($R_{ON}$) and the low impedance state resistance ($R_{OFF}$)) and the dimensions of the crossbar array structure 102 (e.g., the number of word lines 110 (m) and the number of bit lines (n)). The ratio between the resistance of the switched resistance elements 118 ($R_1$) and the resistance of the unswitched resistance elements 116 ($R_2$) is chosen to achieve a desired voltage difference (or voltage swing or sensing margin) between the high impedance output voltage and the low impedance output voltage for an addressed resistive switching element 114, as described in greater detail below. For example, in some embodiments, the switched resistance elements 118 have a resistance ($R_1$) that is greater than the resistance ($R_2$) of the unswitched resistance elements 116 (e.g., $R_1>R_2$), and the ratio of the resistance of the second resistance elements 118 to the resistance of the first resistance elements 116 is greater than about 10 (e.g., $R_1/R_2>10$). However, it should be appreciated that for some crossbar array structures having different dimensions and/or resistive switching elements with different impedance characteristics, it may be desirable that the switched resistance elements 118 have a resistance ($R_1$) that is less than the resistance ($R_2$) of the unswitched resistance elements 116 to achieve a desired voltage swing.

In an exemplary embodiment, the switching elements 120 are realized as transistors. As illustrated in FIG. 1, the transistors 120 are electrically parallel to the resistance elements 118, that is, the source/drain terminals of the transistors 120 are coupled to the terminals of their associated resistance element 118, such that each transistor 120 is capable of effectively short-circuiting its associated resistance element 118 when it is turned on or otherwise activated. In other words, a source/drain terminal of each transistor 120 is coupled to the first reference voltage node 124, and the opposing drain/source terminal of the transistor 120 is coupled to its associated word line 110 via resistance element 116. Thus, when a respective transistor 120 is turned on, its associated switched resistance element 118 is effectively bypassed or otherwise disabled, resulting in the resistance between the reference voltage node 124 and the word line 110 associated with that transistor 120 being equal to the resistance of the unswitched resistance element 116 (e.g., $R_2$). Conversely, when a respective transistor 120 is turned off, its associated switched resistance element 118 is enabled or otherwise activated and electrically in series with its associated unswitched resistance element 116, resulting in the resistance between the reference voltage node 124 and the word line 110 associated with that transistor 120 being equal to the sum of the resistance of the unswitched resistance element 116 and the resistance of the switched resistance element 118 (e.g., $R_1+R_2$).

In the illustrated embodiment, the word line addressing circuitry 104 also includes a word line decoder 122 coupled to the control terminals (or gate terminals) of the transistors 120 and configured to control operation of the transistors 120. As described in greater detail below, to read a particular location of the crossbar array structure 102, the word line decoder 122 turns off or otherwise deactivates the transistor 120 coupled to the word line 110 associated with a resistive switching element 114 at an addressed location in the crossbar array structure 102 to be read (e.g., the addressed resistive switching element) to enable its associated switched resistance element 118 and concurrently turns on or otherwise activates the transistors 120 coupled to the remaining word lines 110 to effectively short-circuit or otherwise disable the switched resistance elements 118 of the remaining word lines 110. For convenience, the word line 110 associated with the addressed resistive switching element 114 may alternatively be referred to herein as the selected word line, and the remaining word lines 110 may alternatively be referred to herein as the unselected word lines. As described in greater detail below, the voltage of the selected word line 110 is influenced by the impedance state of the addressed resistive switching element 114, and is utilized to determine or otherwise identify the digital value stored at the addressed location, and thereby read the digital value at the addressed location of the crossbar array structure 102. In accordance with one embodiment, the word line decoder 122 is realized as a 1-to-m demultiplexer configured to enable the switched resistance element 118 associated with the selected word line 110 by turning off the transistor 120 associated with the selected word line 110 and concurrently disable the switched resistance elements 118 of the unselected word lines 110 by turning on the transistors 120 associated with the unselected word lines 110.

In an exemplary embodiment, the crossbar memory element 100 also includes bit line addressing circuitry 106 coupled to the bit lines 112 of the crossbar array structure 102. In the illustrated embodiment, the bit line addressing circuitry 106 includes, for each bit line of the plurality of bit lines 112, a switching element 126 coupled between the respective bit line 112 and a second reference voltage at the second reference voltage node 130. In an exemplary embodiment, the switching elements 126 are realized as transistors, with each transistor 126 having a source/drain terminal coupled to its associated bit line 112 and its corresponding drain/source terminal coupled to the second reference voltage at the second reference voltage node 130. In the illustrated embodiment, the bit line addressing circuitry 106 also includes a bit line decoder 128 coupled to the control terminals (or gate terminals) of the transistors 126 to control operation of the transistors 126. As described in greater detail below, to read a voltage from an addressed resistive switching element 114 of the crossbar array structure 102, the bit line decoder 128 turns on or otherwise activates the transistor 126 coupled to the bit line 112 associated with the addressed resistive switching element 114 while concurrently turning off or otherwise deactivating the transistors 126 coupled to the remaining bit lines 112. For convenience, the bit line 112 associated with the addressed resistive switching element 114 may alternatively be referred to herein as the selected bit line, and the remaining bit lines 112 may alternatively be referred to herein as the unselected bit lines. In accordance with one embodiment, the bit line decoder 128 is realized as a 1-to-n demultiplexer configured to activate or turn on the transistor 126 associated with the selected bit line 112 and concurrently deactivate or turn off the transistors 126 of the unselected bit lines 112.

In an exemplary embodiment, the output selection circuitry 108 is coupled to the word lines 110 and configured to select the voltage from the selected word line 110, that is, the word line 110 associated with the addressed resistive switching element 114, for provision to the output node 132. In this regard, in accordance with one embodiment, the output selection circuitry 108 is realized as an m-to-1 multiplexer 134 configured to provide the voltage of the selected word line 110 to the output node 132. In this manner, the output voltage ($V_{OUT}$) at the output node 132 is influenced by the impedance state of the addressed resistive switching element 114 being read, and thereby, is indicative of the impedance state of the addressed resistive switching element 114. In practice, the output node 132 may be coupled to comparison circuitry, such as a comparator or other amplifier circuitry, that compares the output voltage ($V_{OUT}$) to a threshold voltage to determine what impedance state the addressed resistive switching element 114 being read is in, and thereby, identify the digital value stored at the addressed location of the crossbar array structure 102.

In an exemplary embodiment, the first reference voltage node 124 is configured to receive a positive reference voltage and the second reference voltage node 130 is configured to receive a ground reference voltage (or negative reference voltage). Accordingly, for convenience, but without limitation, the first reference voltage node 124 may alternatively be referred to herein as the positive reference voltage node, and the second reference voltage node 130 may alternatively be referred to herein as the ground reference voltage node. Thus, as set forth above, when reading an addressed location of the crossbar array structure 102, the selected word line 110 is pulled up to the positive reference voltage by its associated resistance elements 116, 118, while the selected bit line 112 is pulled to the ground reference voltage by its associated transistor 126. As a result, the addressed resistive switching element 114 is electrically in series with the resistance elements 116, 118 between the positive reference voltage node 124 and the ground reference voltage node 130. In this manner, the expected output voltage ($V_{OUT}$) at the output node 132 (e.g., the voltage of the selected word line 110), ignoring parasitic conduction paths, is equal to $$\frac{V_{DD} \times R_{ON}}{R_1 + R_2 + R_{ON}}$$

when the addressed resistive switching element 114 is in the high impedance state and $$\frac{V_{DD} \times R_{OFF}}{R_1 + R_2 + R_{OFF}}$$

when the addressed resistive switching element 114 is in the low impedance state, where $V_{DD}$ is the voltage difference between the positive reference voltage node 124 and the ground reference voltage node 130. The comparison circuitry coupled to the output node 132 may compare the output voltage ($V_{OUT}$) to a threshold voltage value that is between the expected high impedance output voltage and the expected low impedance value to determine whether the addressed resistive switching element 114 is in the high impedance state or the low impedance state, and thereby identify the digital value at the addressed location of the crossbar array structure 102.

It should be understood that FIG. 1 is a simplified representation of a crossbar memory element 100 for purposes of explanation and is not intended to limit the scope or applicability of the subject matter described herein in any way. Thus, although FIG. 1 depicts direct electrical connections between circuit elements and/or terminals, alternative embodiments may employ intervening circuit elements and/or components while functioning in a substantially similar manner. Additionally, although FIG. 1 depicts a 5×5 crossbar array structure 102 having 5 word lines 110 and 5 bit lines, the subject matter is not intended to be limited to any particular number of word lines 110 and/or bit lines 112, and the subject matter described herein may be implemented for a crossbar array structure 102 having any number of word lines 110 and bit lines 112.

Figure 2:
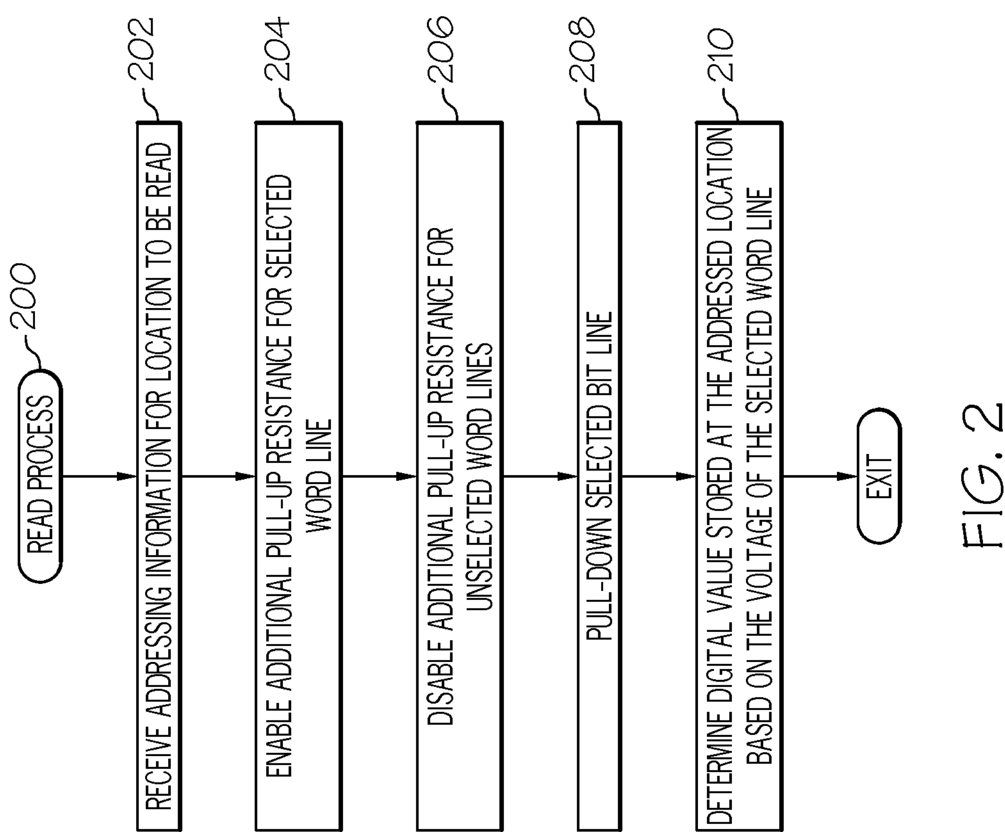
FIG. 2 is a flow diagram of an exemplary read process suitable for use with the crossbar memory element of FIG. 1.

Referring now to FIG. 2, in an exemplary embodiment, an electrical system may be configured to perform a read process 200 and additional tasks, functions, and operations described below. The various tasks may be performed by software, hardware, firmware, or any combination thereof. For illustrative purposes, the following description may refer to elements mentioned above in connection with FIG. 1. In practice, the tasks, functions, and operations may be performed by different elements of the described system, such as the word line addressing circuitry 104, the bit line addressing circuitry 106, the output selection circuitry 108, the transistors 120 and/or the transistors 126. It should be appreciated that any number of additional or alternative tasks may be included, and may be incorporated into a more comprehensive procedure or process having additional functionality not described in detail herein.

Referring to FIG. 2, and with continued reference to FIG. 1, the read process 200 initializes or begins by receiving addressing information corresponding to an addressed location within the crossbar array structure to be read (task 202). In this regard, to read a resistive switching element 114 at a particular location of the crossbar array structure 102, the addressing circuitry 104, 106 receives addressing information indicative of the word line 110 and bit line 112 associated with that addressed resistive switching element 114, that is, the overlapping combination of word line 110 and bit line 112 that the addressed resistive switching element 114 is disposed between. In an exemplary embodiment, the word line addressing circuitry 104 receives addressing information indicative of the word line 110 associated with the addressed resistive switching element 114, and the bit line addressing circuitry 106 receives addressing information indicative of the bit line 112 associated with the addressed resistive switching element 114. For example, for a first resistive switching element 150 in the crossbar array structure 102 to be read, the word line decoder 122 receives addressing information indicative of the word line 160 associated with the addressed resistive switching element 150, and the bit line decoder 128 receives addressing information indicative of the bit line 170 associated with the addressed resistive switching element 150.

Figure 3:
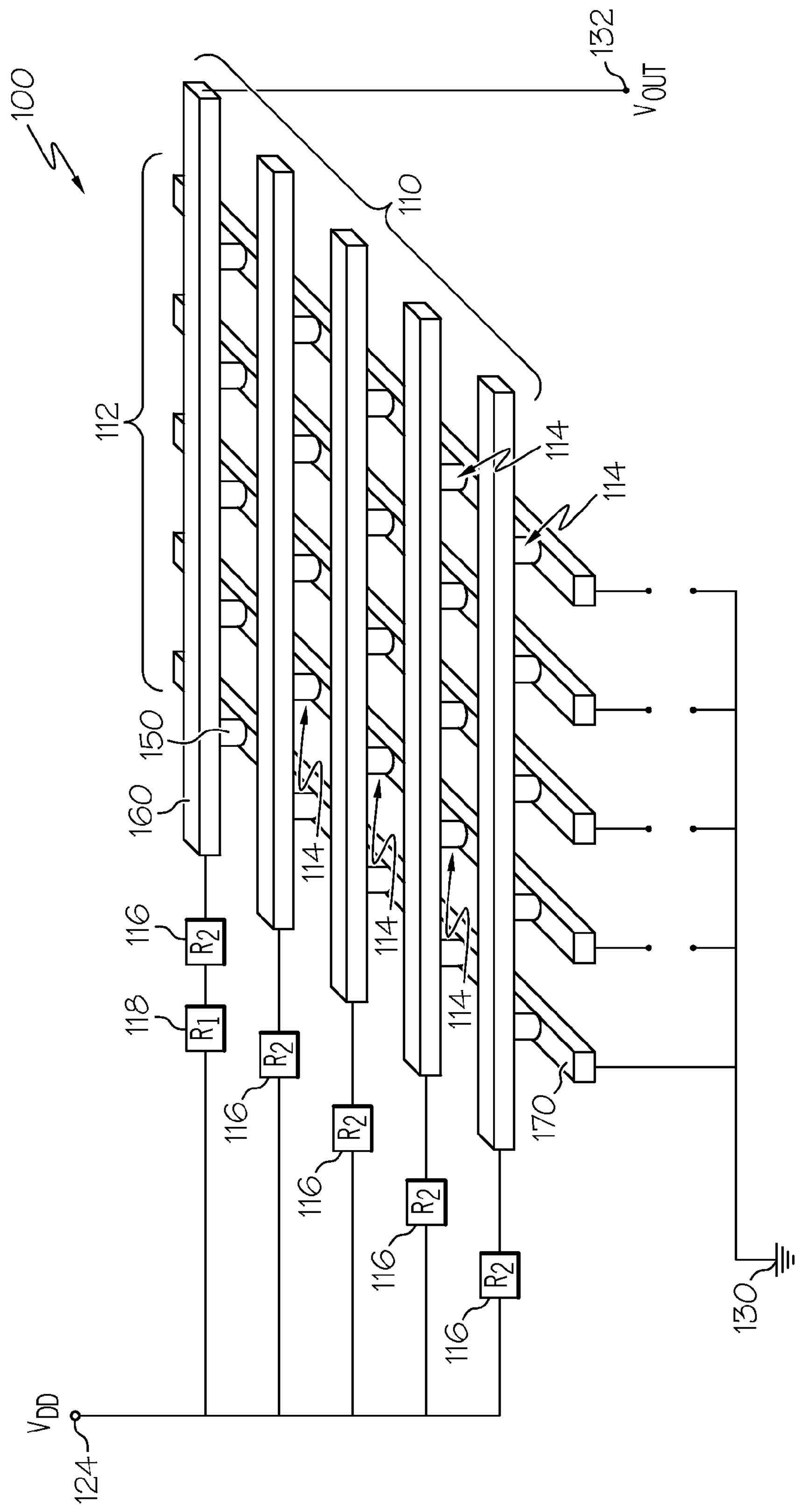
FIG. 3 is a perspective view of a crossbar memory element of FIG. 1 depicting the effective state of operation for the addressing circuitry and output selection circuitry for reading an addressed resistive switching element in accordance with one embodiment.

In an exemplary embodiment, the read process 200 continues by enabling an additional pull-up resistance for the selected word line and concurrently disabling the additional pull-up resistance for the unselected word lines (tasks 204, 206). In this regard, in response to addressing information indicative of the selected word line 110, the word line decoder 122 deactivates or otherwise turns off the transistor 120 associated with the selected word line 110 to enable the switched resistance element 118. For example, referring now to FIG. 1 and FIG. 3, in response to receiving addressing information indicative of a first resistive switching element 150 in the crossbar array structure 102, the word line decoder 122 selects the word line 160 associated with the addressed resistive switching element 150 by deactivating or turning off transistor 120 to enable the switched resistance element 118 associated with the addressed resistive switching element 150 and provide two resistance elements 116, 118 electrically in series between the reference voltage node 124 and the selected word line 160. As described above, the word line decoder 122 concurrently activates or turns on the transistors 120 associated with the unselected word lines 110 to disable the switched resistance elements 118 and provide only one resistance element 116 electrically in series between the reference voltage node 124 and the unselected word lines 110. In this regard, FIG. 3 illustrates the effective resistances between the reference voltage node 124 and the word lines 110 after enabling the switched resistance element 118 for the selected word line 160. In this manner, the resistance between the reference voltage node 124 and the selected word line 160 is equal to the sum of the resistance of the unswitched resistance element 116 and the resistance of the switched resistance element 118 (e.g., $R_1+R_2$), and the resistance between the reference voltage node 124 and the unselected word lines 110 is equal to the resistance of the unswitched resistance element 116 (e.g., $R_2$).

Referring again to FIG. 2, in an exemplary embodiment, the read process 200 continues by pulling-down the voltage of the selected bit line (task 208). In this regard, in response to addressing information indicative of the selected bit line 112, the bit line decoder 128 activates or turns on the transistor 126 associated with the selected bit line 112 to provide the voltage at the ground reference voltage node 130 to the selected bit line 112. For example, referring again to FIG. 3, in response to receiving addressing information indicative of resistive switching element 150, the bit line decoder 128 selects its associated bit line 170 by activating or turning on the transistor 126 associated with the selected bit line 170 to provide the ground reference voltage at the ground reference voltage node 130 to the selected bit line 170. In this manner, the addressed resistive switching element 150 provides a path for current between the pulled-up voltage of the selected word line 160 and the ground reference voltage of the selected bit line 170. As illustrated by FIG. 3, in accordance with one or more embodiments, the bit line decoder 128 concurrently deactivates (or turns off) the transistors 126 associated with the unselected bit lines 112, allowing the voltages of the unselected bit lines 112 to float. As described in greater detail below in the context of FIGS. 4-5, in accordance with some embodiments, the unselected bit lines 112 are pulled-up to the voltage at the reference voltage node 124 by a third resistance.

Referring again to FIG. 2, in an exemplary embodiment, the read process 200 continues by determining or otherwise identifying the digital value at the addressed location of the crossbar array structure based on the voltage of the selected word line after enabling the additional pull-up resistance for the selected word line (task 210). In this regard, in response to addressing information indicative of the selected word line 110, the output selection circuitry 108 selects the voltage of the selected word line 110 for provision to the output node 132. For example, referring again to FIG. 1 and FIG. 3, in response to receiving addressing information indicative of the first resistive switching element 150, the multiplexer 134 selects the voltage of the selected word line 160 for provision to the output node 132, as illustrated by FIG. 3. In this manner, as set forth above, the output voltage ($V_{OUT}$) at the output node 132 is equal to $$\frac{V_{DD}\times R_{ON}}{R_1+R_2+R_{ON}}$$

when the addressed resistive switching element 150 is in the high impedance state, and $$\frac{V_{DD}\times R_{OFF}}{R_1+R_2+R_{OFF}}$$

when the addressed resistive switching element 150 is in the low impedance state. In this regard, a first digital value may be identified as the stored digital value of the addressed resistive switching element 150 when the output voltage is greater than a threshold voltage, and a second digital value may be identified as the stored digital value of the addressed resistive switching element 150 when the output voltage is less than the threshold voltage. For example, the read process 200 may compare the output voltage ($V_{OUT}$) to a threshold voltage value ($V_{TH}$) that is between the theoretical high impedance output voltage and the theoretical low impedance value (e.g., $$\frac{V_{DD}\times R_{OFF}}{R_1+R_2+R_{OFF}} < V_{TH} < \frac{V_{DD}\times R_{ON}}{R_1+R_2+R_{ON}})$$

to determine whether the addressed resistive switching element 114 is in the high impedance state (e.g., when $V_{OUT}>V_{TH}$) or the low impedance state (e.g., when $V_{OUT}<V_{TH}$), and thereby identify the digital value at the addressed location of the crossbar array structure 102. In practice, the parasitic conduction paths caused by resistive switching element 114 at the non-addressed locations of the crossbar array structure 102 reduce the voltage differential between the high impedance state output voltage and the low impedance state output voltage. In this regard, pulling-up the voltage of the unselected word lines 110 using a resistance that is less than the resistance used to pull-up the voltage of the selected word line 160 reduces the impact of the parasitic conduction paths and maintains a voltage differential between the high impedance state output voltage and the low impedance state output voltage, thereby ensuring that the addressed location of the crossbar array structure 102 may be read.

Figure 4:
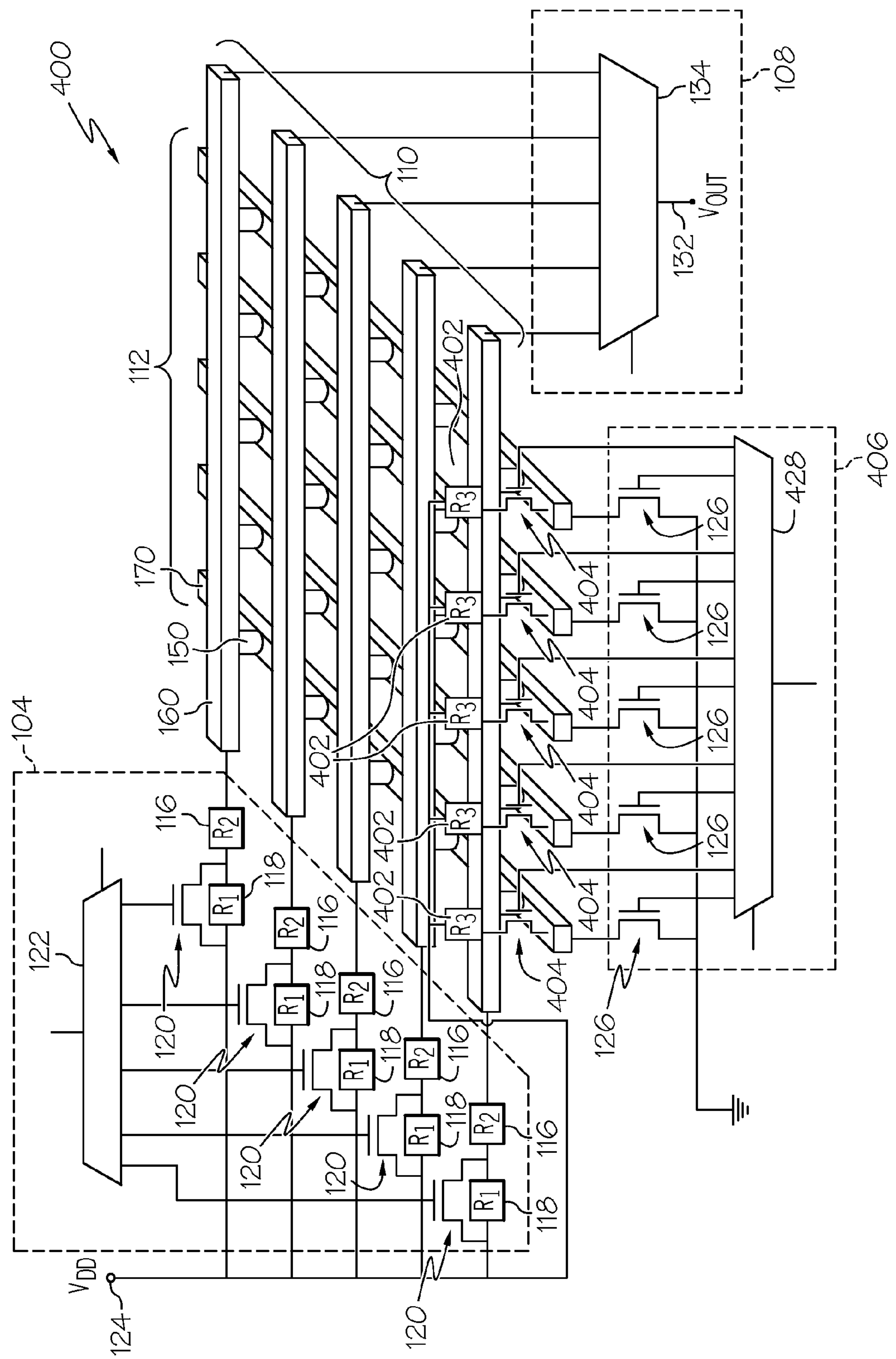
FIG. 4 is a perspective view of a crossbar memory element in accordance with one embodiment.
Figure 5:
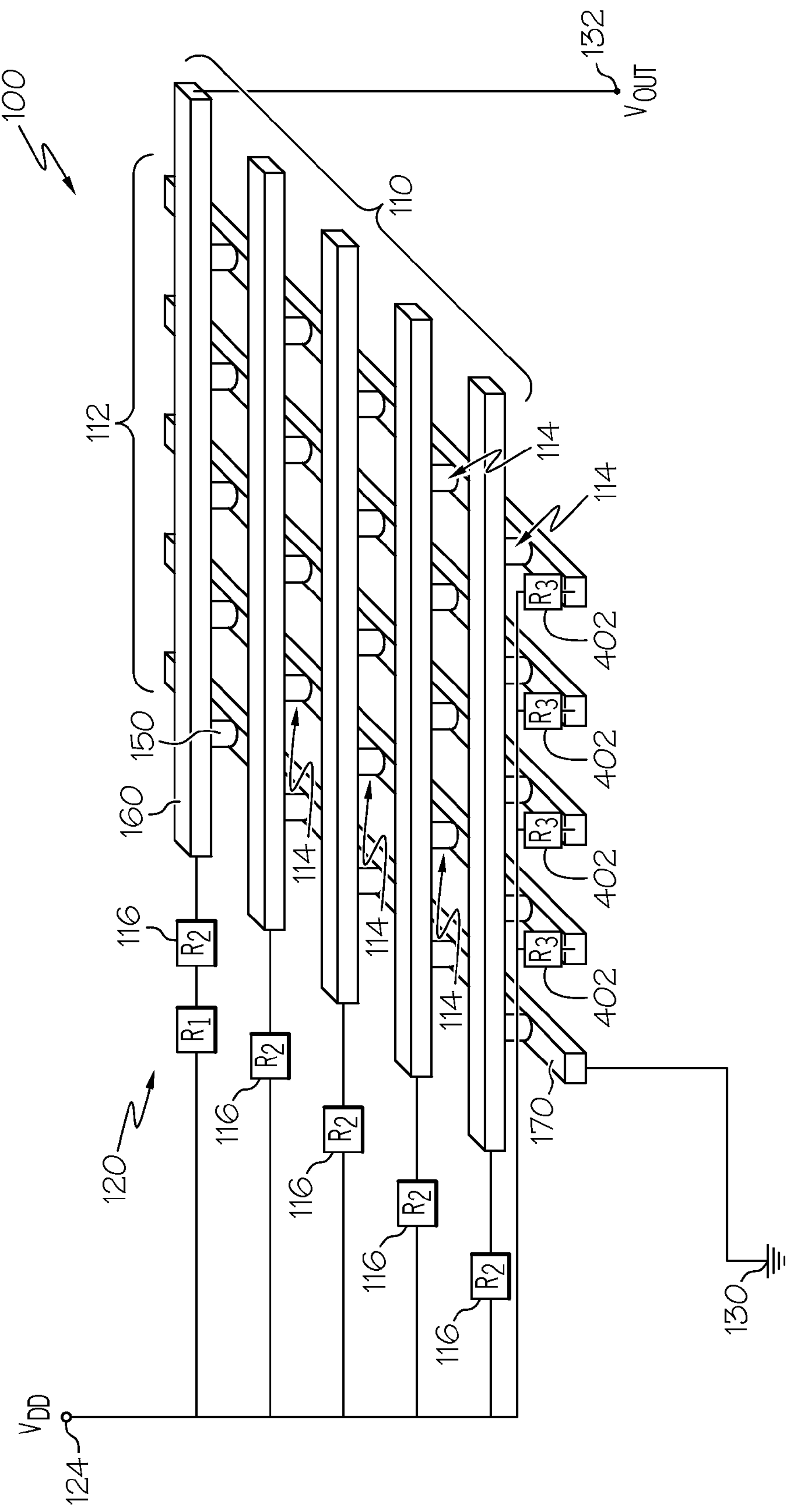
FIG. 5 is a perspective view of the crossbar memory element of FIG. 4 depicting the effective state of operation for the addressing circuitry and output selection circuitry for reading an addressed resistive switching element in accordance with one embodiment.

Referring now to FIGS. 4-5, in accordance with another embodiment, a crossbar memory element 400 includes bit line addressing circuitry 406 configured to couple the selected bit line 170 and the unselected bit lines 112 to different voltage potentials. The bit line addressing circuitry 406 includes, for each bit line 112, a resistance element 402 and a switching element 404 configured electrically in series between the positive reference voltage node 124 and the respective bit line 112. The remaining elements of the crossbar memory element 400 are similar to corresponding elements described above in the context of FIGS. 1-3, and accordingly, will not be redundantly described in the context of FIGS. 4-5. As described in greater detail below, the bit line addressing circuitry 406 couples the selected bit line 170 to the ground reference voltage and couples the unselected bit lines 112 to the positive reference voltage, thereby pulling the voltage of the unselected bit lines 112 up to a different voltage potential than that of the selected bit line 170.

In an exemplary embodiment, the resistance elements 402 are realized as resistors coupled electrically in series between the positive reference voltage node 124 and its associated switching element 404. In an exemplary embodiment, the resistance elements 402 each have substantially the same resistance value (e.g., within realistic and/or practical operating tolerances). The resistance of the resistance elements 402 (e.g., $R_3$) is chosen to provide a desired voltage difference between the high impedance output voltage and the low impedance output voltage for an addressed resistive switching element 114, in a similar manner as described above. In this regard, the resistance of the resistance elements 402 will vary depending upon the high impedance state resistance ($R_{ON}$) and the low impedance state resistance ($R_{OFF}$) of the resistive switching elements 114 of the crossbar array structure 102, the number of word lines 110 (m) and the number of bit lines (n) in the crossbar array structure 102, and the word line resistance elements 116, 118 (e.g., $R_1$ and $R_2$). In an exemplary embodiment, the switching elements 404 are realized as transistors, with each transistor 404 having a source/drain terminal coupled to its associated bit line 112 and its corresponding drain/source terminal coupled to the positive reference voltage at the positive reference voltage node 124 via its associated resistance element 402. The bit line addressing circuitry 406 also includes a bit line decoder 428 coupled to the control terminals (or gate terminals) of the transistors 404 to control operation of the transistors 404 in conjunction with transistors 126.

As described above, to read a voltage from an addressed resistive switching element 114 of the crossbar array structure 102, the bit line decoder 428 turns on or otherwise activates the transistor 126 coupled to the selected bit line 112 while concurrently turning off or otherwise deactivating the transistors 126 coupled to the unselected bit lines 112. Additionally, in the illustrated embodiment of FIGS. 4-5, the bit line decoder 428 turns off or otherwise deactivates the transistor 404 coupled to the selected bit line 112 while concurrently turning on or otherwise activating the transistors 404 coupled to the unselected bit lines 112, thereby enabling the resistance elements 402 associated with the unselected bit lines 112. In this manner, the resistance elements 402 pull-up the voltage of the unselected bit lines 112 to the positive reference voltage at the positive reference voltage node 124. For example, as illustrated by FIG. 5, in response to receiving addressing information indicative of resistive switching element 150, the bit line decoder 428 selects its associated bit line 170 by activating or turning on the transistor 126 associated with the selected bit line 170, and concurrently deactivating or turning off the transistor 404 associated with the selected bit line 170, to thereby provide the ground reference voltage at the ground reference voltage node 130 to the selected bit line 170. Concurrently, the bit line decoder 428 concurrently deactivates or turns off the transistors 126 associated with the unselected bit lines 112, and activates or turns on the transistors 404 associated with the unselected bit lines 112, thereby enabling the resistance elements 402 of the unselected bit lines 112 and allowing the voltages of the unselected bit lines 112 to be pulled up by the resistance elements 402.

Still referring to FIGS. 4-5, as described above, the output selection circuitry 108 selects the voltage of the selected word line 160 for provision to the output node 132, and the output voltage ($V_{OUT}$) may be compared to a threshold voltage value ($V_{TH}$) that is between the theoretical high impedance output voltage and the theoretical low impedance value to determine whether the addressed resistive switching element 114 is in the high impedance state or the low impedance state, and thereby identify the digital value at the addressed location of the crossbar array structure 102. Pulling-up the voltage of the unselected word lines 110 and the unselected bit lines 112 reduces the impact of the parasitic conduction paths and maintains a voltage differential between the high impedance state output voltage and the low impedance state output voltage, thereby ensuring that the addressed location of the crossbar array structure 102 may be read. Additionally, pulling up the unselected bit lines 112 reduces the current flowing in the parasitic conduction paths, and thereby reduces the power consumption and improves efficiency of read operations.

Figure 6:
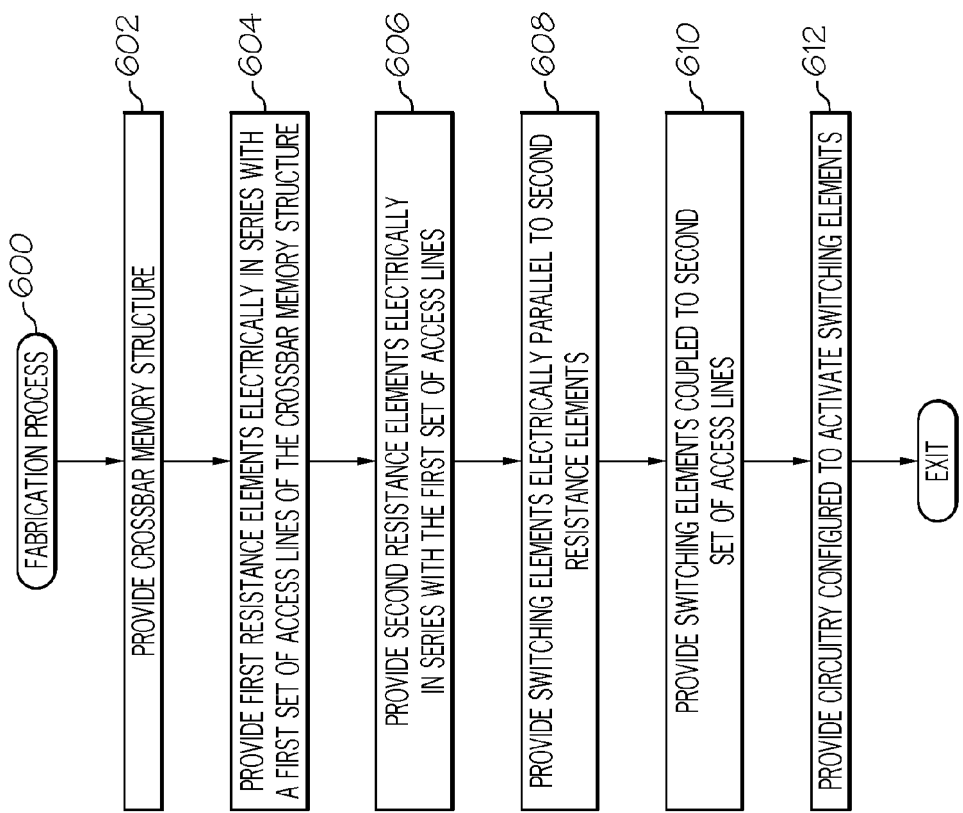
FIG. 6 is a flow diagram of an exemplary fabrication process suitable for use in forming a crossbar memory element in accordance with one or more embodiments.

FIG. 6 illustrates a fabrication process 600 for forming a crossbar memory element. The fabrication process 600 begins by forming or otherwise providing a crossbar array structure (task 602). In this regard, the fabrication process 600 may begin by forming the crossbar array structure 102 having a first set of conductive access lines 110 and a second set of conductive access lines 112, wherein the second set of access lines 112 are oriented orthogonally to the first set of access lines 110, and resistive switching elements 114 are disposed between the access lines 110, 112 at locations where the access lines 110, 112 overlap. As set forth above in the context of FIG. 1, for convenience, but without limitation, the first set of access lines 110 may alternatively be referred to herein as the word lines, and the second set of access lines 112 may alternatively be referred to herein as the bit lines. The fabrication process 600 continues by forming or otherwise providing first resistance elements electrically in series with access lines of a first set of access lines of the crossbar array structure (task 604). In this regard, the fabrication process 600 may form an unswitched resistance element 116 configured electrically in series between each of the word lines 110 of the crossbar array structure 102 and a reference voltage node 124. The fabrication process 600 continues by forming or otherwise providing a second resistance element electrically in series with the first resistance element and the access lines of the first set of access lines and a switching element configured electrically parallel to the second resistance element (tasks 606, 608). For example, the fabrication process 600 may form a second resistance element 118 configured electrically in series between each of the word lines 110 of the crossbar array structure 102 and a reference voltage node 124, and form a transistor 120 configured electrically parallel to each second resistance element 118 as described above.

In an exemplary embodiment, the fabrication process 600 continues by forming or otherwise providing switching elements coupled to access lines of a second set of access lines (task 610). For example, the fabrication process 600 may form transistors 126 coupled between bit lines 112 of the crossbar array structure 102 and a second reference voltage node 130, as described above. In accordance with one or more embodiments, the fabrication process 600 also forms transistors 404 coupled between bit lines 112 of the crossbar array structure 102 and the other reference voltage node 124. In such embodiments, the fabrication process 600 also forms resistance elements 402 coupled between reference voltage node 124 and the bit lines 112 via transistors 404. The fabrication process 600 continues by forming or otherwise providing circuitry configured to activate the switching elements coupled to the access lines (task 612). In this regard, the fabrication process 600 forms decoder circuitry 122, 128, 428 configured to activate and/or deactivate the transistors 120, 126, 404 of the selected/unselected access lines 110, 112 as described above. Fabrication of a crossbar memory element

100, 400 may be completed using well known final process steps, and other back end process steps, which will not be described in detail herein.

To briefly summarize, one advantage of the crossbar memory elements and read methods described herein is that an addressed location in a crossbar array structure may be reliably and accurately read regardless of the parasitic conduction paths within the crossbar array structure. As described above, pulling-up the voltage of the unselected word lines using a resistance that is less than the resistance used to pull-up the selected word line reduces the impact of the parasitic conduction paths and maintains a voltage differential between the high impedance state output voltage and the low impedance state output voltage, thereby ensuring that an addressed location of the crossbar array structure may be read. Furthermore, in some embodiments, the unselected bit lines may also be pulled-up to further reduce the impact of the parasitic conduction paths and reduce the current flowing in the parasitic conduction paths, thereby reducing power consumption.

For the sake of brevity, conventional techniques related to crossbar array structures and other functional aspects of crossbar memory elements may not be described in detail herein. Although the figures may depict one exemplary arrangement of elements, additional intervening elements, devices, features, or components may be present in an embodiment of the depicted subject matter. As used herein, a "node" means any internal or external reference point, connection point, junction, signal line, conductive element, or the like, at which a given signal, logic level, voltage, data pattern, current, or quantity is present. Additionally, certain terminology may also be used in the following description for the purpose of reference only, and thus is not intended to be limiting, and the terms "first", "second" and other such numerical terms referring to structures do not imply a sequence or order unless clearly indicated by the context.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A memory element comprising:

a crossbar array structure including a first set of access lines and a second set of access lines;

a plurality of first resistance elements coupled electrically in series between the first set of access lines and a reference voltage node;

a plurality of switched resistance elements coupled electrically in series between the first set of access lines and the reference voltage node; and a plurality of resistive switching elements coupled between the first set of access lines and the second set of access lines, each resistive switching element being disposed between an overlapping location of a respective access line of the first set of access lines and a respective access line of the second set of access lines.

2. The memory element of claim 1, wherein:

each first resistance element of the plurality of first resistance elements is coupled electrically in series between a respective access line of the first set of access lines and the reference voltage node; and each switched resistance element of the plurality of switched resistance elements is coupled electrically in series between a respective access line of the first set of access lines and the reference voltage node.

3. The memory element of claim 2, wherein each switched resistance element comprises:

a second resistance element coupled electrically in series with a respective first resistance element of the plurality of first resistance elements; and a switching element configured electrically parallel to the second resistance element.

4. The memory element of claim 1, further comprising addressing circuitry coupled to the plurality of switched resistance elements, wherein in response to addressing information indicative of a first access line of the first set of access lines, the addressing circuitry is configured to enable a first switched resistance element of the plurality of switched resistance elements while concurrently disabling remaining switched resistance elements of the plurality of switched resistance elements, the first switched resistance element being associated with the first access line.

5. The memory element of claim 4, wherein each switched resistance element comprises:

a second resistance element coupled electrically in series with a respective first resistance element of the plurality of first resistance elements; and a switching element configured electrically parallel to the second resistance element.

6. The memory element of claim 5, each second resistance element having a second resistance and each first resistance element having a first resistance, wherein the addressing circuitry is configured to enable the first switched resistance element while concurrently disabling the remaining switched resistance elements by:

turning off a switching element of the first switched resistance element, resulting in the first resistance and the second resistance being configured electrically in series between the first access line and the reference voltage node; and turning on switching elements of the remaining switched resistance elements, resulting in the first resistance being configured electrically in series between remaining access lines of the first set of access lines and the reference voltage node.

7. The memory element of claim 4, wherein:

the crossbar array structure includes a second set of access lines the addressing information is indicative of a resistive switching element of the crossbar array structure coupled between the first access line of the first set of access lines and a second access line of the second set of access lines;

the reference voltage node is configured to receive a positive reference voltage; and the second access line is coupled to a ground reference voltage in response to the addressing information.

8. The memory element of claim 1, wherein:

the first set of access lines includes;

a first access line; and a second access line;

the plurality of first resistance elements includes:

a first unswitched resistance element coupled electrically in series between the first access line and the reference voltage node; and a second unswitched resistance element coupled electrically in series between the second access line and the reference voltage node;

the plurality of switched resistance elements includes:

a third resistance element coupled electrically in series between the first access line and the reference voltage node;

a first transistor configured electrically parallel to the third resistance element;

a fourth resistance element coupled electrically in series between the second access line and the reference voltage node; and a second transistor configured electrically parallel to the fourth resistance element.

9. The memory element of claim 8, further comprising addressing circuitry coupled to the first transistor and the second transistor, wherein in response to addressing information indicative of a resistive switching element associated with the first access line, the addressing circuitry is configured to:

turn off the first transistor, resulting in the first unswitched resistance element and the third resistance element being configured electrically in series between the first access line and the reference voltage node; and turn on the second transistor while the first transistor is turned off, resulting in the second unswitched resistance element being configured electrically in series between the second access line and the reference voltage node.

10. The memory element of claim 9, further comprising output selection circuitry configured to select a voltage of the first access line for provision to an output node in response to the addressing information, the voltage of the first access line being influenced by the resistive switching element associated with the first access line.

11. The memory element of claim 10, wherein:

the voltage of the first access line is indicative of a first digital value stored by the resistive switching element when the voltage at the output node is greater than a threshold voltage; and the voltage of the first access line is indicative of a second digital value stored by the resistive switching element when the voltage at the output node is less than the threshold voltage.

12. The memory element of claim 10, the crossbar array structure including a second set of access lines, wherein the memory element further comprises second addressing circuitry coupled to the second set of access lines, the second addressing circuitry being configured to couple a third access line of the second set of access lines to a second reference voltage node in response to the addressing information indicative of the resistive switching element, the third access line being associated with the resistive switching element.

13. The memory element of claim 12, wherein:

the reference voltage node is configured to receive a positive reference voltage; and the second reference voltage node is configured to receive a ground reference voltage.

14. The memory element of claim 13, wherein:

the second set of access lines includes a fourth access line; and the second addressing circuitry is configured to couple the fourth access line to the reference voltage node in response to the addressing information indicative of the resistive switching element.

15. A method for forming a crossbar memory element, the crossbar memory element including a crossbar array structure having a first set of access lines and a second set of access lines, the method comprising:

forming, for each access line of the first set of access lines, a first resistance element electrically in series between the respective access line and a first node;

forming, for each access line of the first set of access lines, a second resistance element electrically in series between the respective access line and the first node; and forming, for each access line of the first set of access lines, a switching element electrically parallel to the second resistance element of the respective access line.

16. The method of claim 15, further comprising the step of forming addressing circuitry coupled to the switching element of each access line, the addressing circuitry being configured to turn on the respective switching element for a selected access line of the first set of access lines and concurrently turn off switching elements for unselected access lines of the first set of access lines.

17. A method for reading a digital value corresponding to a resistive switching element in a crossbar array structure, the crossbar array structure comprising a first set of access lines and a second set of access lines, each access line of the first set of access lines having a first resistance electrically in series between the respective access line and a reference voltage node, the method comprising:

providing a plurality of the resistive switching elements coupled between the first set of access lines and the second set of access lines, each of the resistive switching elements being disposed between an overlapping location of a respective access line of the first set of access lines and a respective access line of the second set of access lines to provide a path for current between the first access line and the second access line;

providing a second resistance electrically in series between the reference voltage node and a first access line of the first set of access lines, the first access line being associated with the resistive switching element; and identifying the digital value based on a voltage of the first access line after providing the second resistance electrically in series between the reference voltage node and the first access line.

18. The method of claim 17, further comprising:

providing a positive reference voltage to the reference voltage node; and providing a negative reference voltage to a second access line of the second set of access lines.

19. The method of claim 18, further comprising coupling remaining access lines of the second set of access lines to the positive reference voltage.

* * * * *